United States Patent
Wan et al.

(10) Patent No.: US 8,880,964 B2
(45) Date of Patent: Nov. 4, 2014

(54) BLOCK AND PAGE LEVEL BAD BIT LINE AND BITS SCREENING METHODS FOR PROGRAM ALGORITHM

(71) Applicant: SanDisk Technologies Inc., Plano, TX (US)

(72) Inventors: Jun Wan, San Jose, CA (US); Bo Lei, San Ramon, CA (US); Feng Pan, San Jose, CA (US); Yongke Sun, Pleasanton, CA (US)

(73) Assignee: SanDisk Technologies Inc., Plano, TX (US)

( * ) Notice: Subject to any disclaimer, the term of this patent is extended or adjusted under 35 U.S.C. 154(b) by 118 days.

(21) Appl. No.: 13/622,765

(22) Filed: Sep. 19, 2012

(65) Prior Publication Data

US 2014/0082437 A1 Mar. 20, 2014

(51) Int. Cl.
*G11C 29/00* (2006.01)
*G11C 16/34* (2006.01)

(52) U.S. Cl.
CPC .......... *G11C 16/349* (2013.01); *G11C 16/3431* (2013.01); *G11C 16/3422* (2013.01); *G11C 16/3459* (2013.01); *G11C 16/3413* (2013.01); *G11C 16/3418* (2013.01); *G11C 16/345* (2013.01); *G11C 16/3445* (2013.01); *G11C 16/3409* (2013.01)
USPC ...................... 714/718; 365/185.09; 365/200

(58) Field of Classification Search
CPC ........... G11C 16/3409; G11C 16/3413; G11C 16/3418; G11C 16/3422; G11C 16/3431
USPC ............................ 714/718; 365/185.09, 200
See application file for complete search history.

(56) References Cited

U.S. PATENT DOCUMENTS

| | | | |
|---|---|---|---|
| 7,512,014 B2 | 3/2009 | Tran et al. | |
| 7,532,524 B2 | 5/2009 | Hartono et al. | |
| 8,055,957 B2 | 11/2011 | Kondo | |
| 8,069,382 B2 | 11/2011 | Aritome | |
| 2006/0171202 A1 | 8/2006 | Kawamoto et al. | |
| 2007/0237011 A1* | 10/2007 | Roohparvar | 365/200 |
| 2009/0323417 A1* | 12/2009 | Takada | 365/185.09 |
| 2014/0085978 A1* | 3/2014 | Lee | 365/185.08 |

OTHER PUBLICATIONS

International Search Report & The Written Opinion of the International Searching Authority dated Dec. 11, 2013, International Application No. PCT/US2013/058470.

* cited by examiner

*Primary Examiner* — Sam Rizk
(74) *Attorney, Agent, or Firm* — Vierra Magen Marcus LLP

(57) ABSTRACT

A programming process evaluates NAND strings of a block to detect a defective NAND string, e.g., a NAND string with a defective storage element. Status bits can be stored which identify the defective NAND string. Original data which is to be written in the NAND string is modified so that programming of the defective NAND string does not occur. For example, a bit of write data which requires a storage element in the defective NAND string to be programmed to a higher data state is modified (e.g., flipped) so that no programming of the storage element is required. Subsequently, when a read operation is performed, the flipped bits are flipped back to their original value, such as by using error correction code decoding. In an erase process, a count of defective NAND strings is made and used to adjust a pass condition of a verify test.

20 Claims, 13 Drawing Sheets

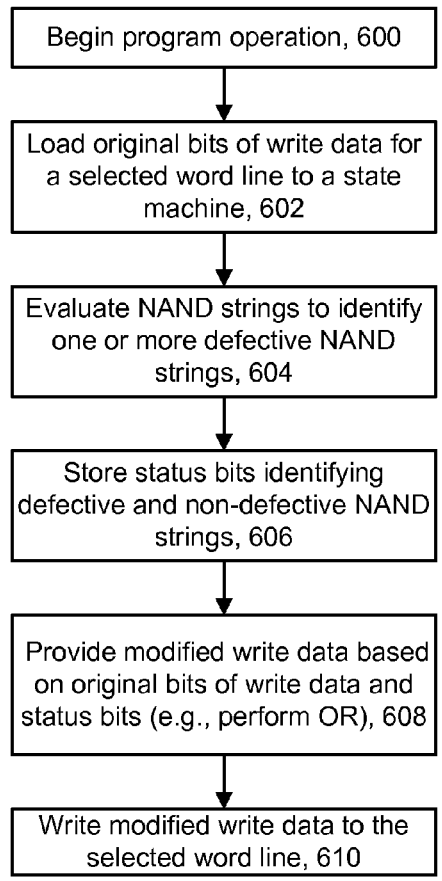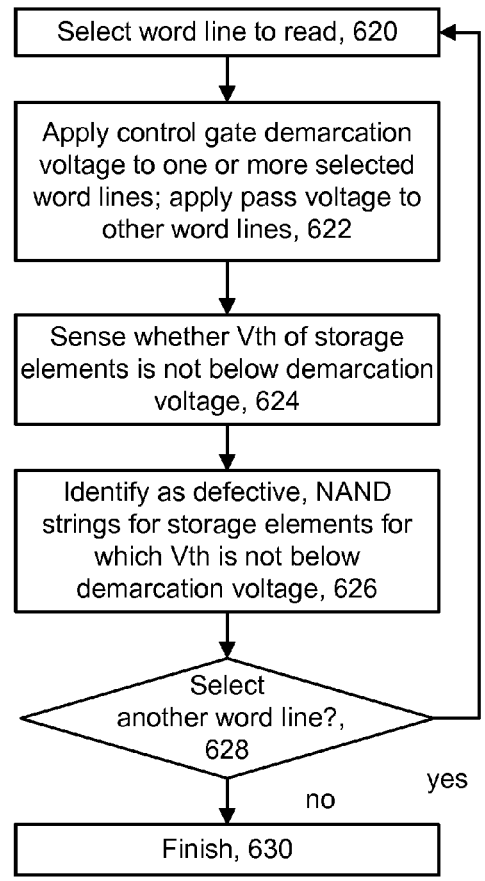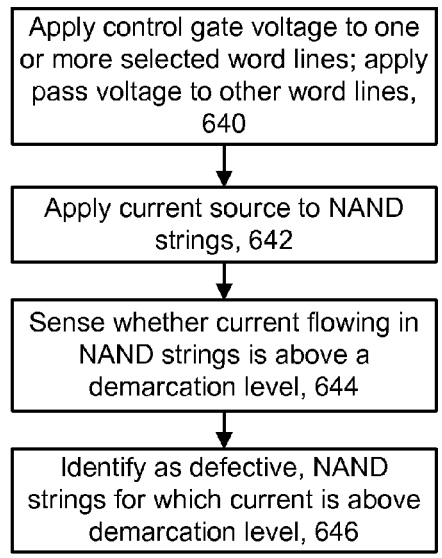

| (1) BL: | 0 | 1 | 2 | 3 | 4 | 5 | 6 | 7 | 8 | 9 | 10 | 11 |
|---|---|---|---|---|---|---|---|---|---|---|---|---|
| (2) WL status bits (WL62): | 0 | 0 | 0 | 0 | 0 | 1 | 0 | 0 | 0 | 0 | 0 | 0 |
| (3) WL status bits (WL3): | 0 | 0 | 0 | 0 | 0 | 0 | 0 | 0 | 0 | 1 | 0 | 0 |
| (4) WL status bits (other WLs): | 0 | 0 | 0 | 0 | 0 | 0 | 0 | 0 | 0 | 0 | 0 | 0 |
| (5) NAND string status bits: | 0 | 0 | 0 | 0 | 0 | 1 | 0 | 0 | 0 | 1 | 0 | 0 |
| (6) Original write data bit: | 0 | 1 | 0 | 1 | 0 | 0 | 0 | 0 | 0 | 1 | 0 | 0 |
| (7) Modified write data bit: | 0 | 1 | 0 | 1 | 0 | 1 | 0 | 0 | 0 | 1 | 0 | 0 |

(7)=(5) OR (6)

| A | B | A OR B |
|---|---|---|
| 0 | 0 | 0 |
| 0 | 1 | 1 |
| 1 | 0 | 1 |
| 1 | 1 | 1 |

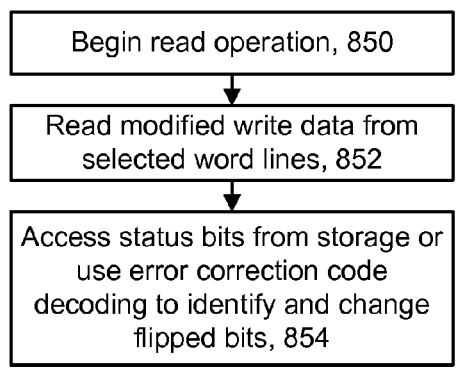
Fig. 8B
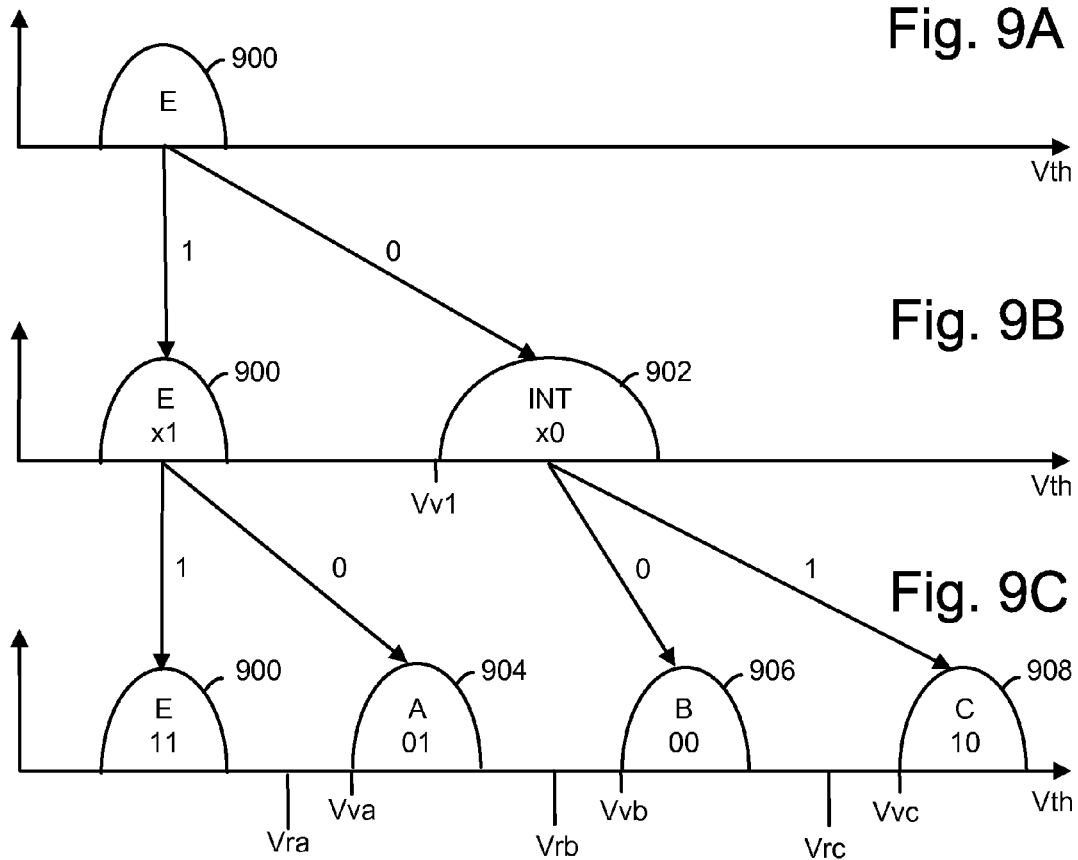

BLOCK AND PAGE LEVEL BAD BIT LINE AND BITS SCREENING METHODS FOR PROGRAM ALGORITHM

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

However, due to variations in the manufacturing process, there are typically a number of defective storage elements in a memory device, resulting in a performance and yield impact.

BRIEF DESCRIPTION OF THE DRAWINGS

FIG. 6A depicts a method for programming in which defective NAND strings are identified.

FIG. 6B depicts one approach to identifying defective NAND strings as set forth in step 604 of FIG. 6A.

FIG. 6C depicts another approach to identifying defective NAND strings as set forth in step 604 of FIG. 6A.

FIG. 8B depicts a process for reading modified write data.

FIGS. 9A-C depict programming of lower and upper pages in two-bit, four-level storage elements.

DETAILED DESCRIPTION

A method and non-volatile storage system are provided for detecting defective NAND string and modifying a programming or erasing process to account for the defects.

Due to variations in the fabrication process, defects can occur in a memory array at the local block level and page/word line level. Since the defects are not global, they cannot be repaired. As a result, during a programming process, for instance, the memory device will attempt to program the defective storage elements. However, since they are defective, they will be stuck at one data state, typically the erased state. The programming process will therefore execute additional program loops in an attempt to program the defective storage elements, leading to reliability issues, increased program disturb and causing errors that cannot be corrected even with error correction code (ECC) coding. Similarly, an erase process may execute additional erase loops in an attempt to erase defective storage elements which are stuck in a programmed state.

A programming process provided herein evaluates the NAND strings of a block to detect a defective NAND string, e.g., a NAND string with a defective storage element. Status bits can be stored which identify the defective NAND string. Original data which is to be written in the NAND string is modified so that programming of the defective NAND string does not occur. For example, a bit of write data which requires a storage element in the defective NAND string to be programmed to a higher data state is modified (e.g., flipped) so that no programming of the storage element is required. In one approach, modified write data is obtained by an OR operation of original write data and status bits which identify the defective NAND string. Subsequently, when a read operation is performed, the flipped bits are flipped back to their original value based on the status bits or based on an ECC decoding process. The process can take care of block/page level defects and improve reliability. Moreover, memory yield may be improved.

In an erase process, a count of defective NAND strings is made and used to adjust a pass condition of a verify test. For example, the allowable number of failures of the verify test can be increased based on the count. As a result, the number of erase loops are not increased and reliability issues are avoided.

Figure 1:
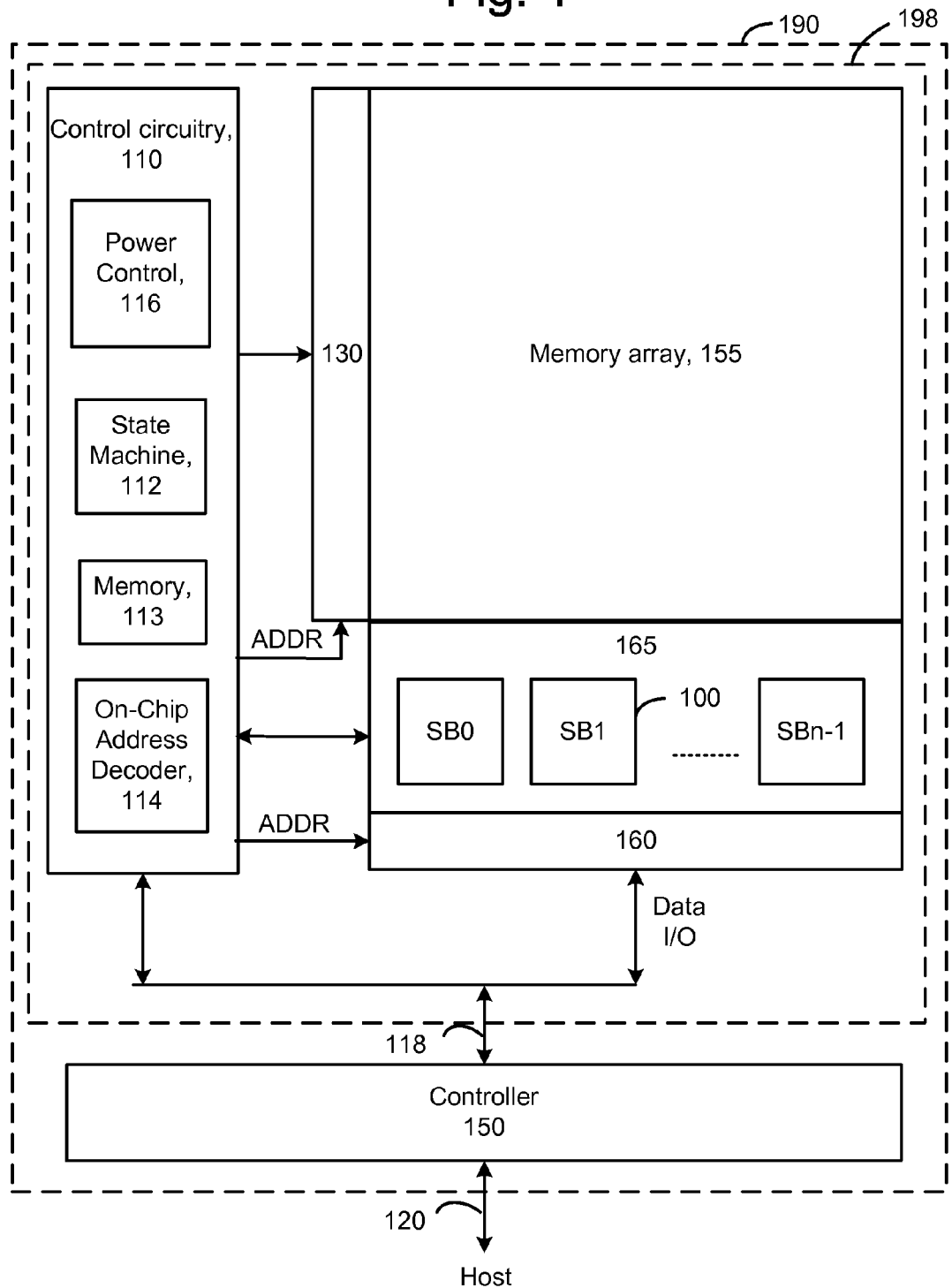
FIG. 1 is a block diagram of a non-volatile memory system using single row/column decoders and read/write circuits.

An example memory system which can be used is discussed next. Generally, any type of non-volatile memory can be used. A memory with NAND strings is an example only. FIG. 1 is a block diagram of a non-volatile memory system using single row/column decoders and read/write circuits. The diagram illustrates a memory device 190 having read/write circuits for reading and programming a page of storage elements in parallel, according to one embodiment. Memory device 190 may include one or more memory die 198. Memory die 198 includes a two-dimensional memory array of storage elements 155, control circuitry 110, and read/write circuits 165.

In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 190 (e.g., a removable storage card) as the one or more memory die 198. Commands and data are transferred between the host and controller 150 via lines 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. A memory 113 can store original write data, modified write data and status bits for use by the state machine as discussed further below.

In some implementations, some of the components of FIG. 1 can be combined. In various designs, one or more of the components (alone or in combination), other than memory array 155, can be thought of as a managing or control circuit. For example, one or more control circuits may include any one of, or a combination of, control circuitry 110, state machine 112, decoders 114/160, power control module 116, sense blocks 100 (including the processor 192 in FIG. 3), read/write circuits 165, and controller 150, etc. The sense block 100 is discussed further in connection with FIG. 3.

Figure 2:
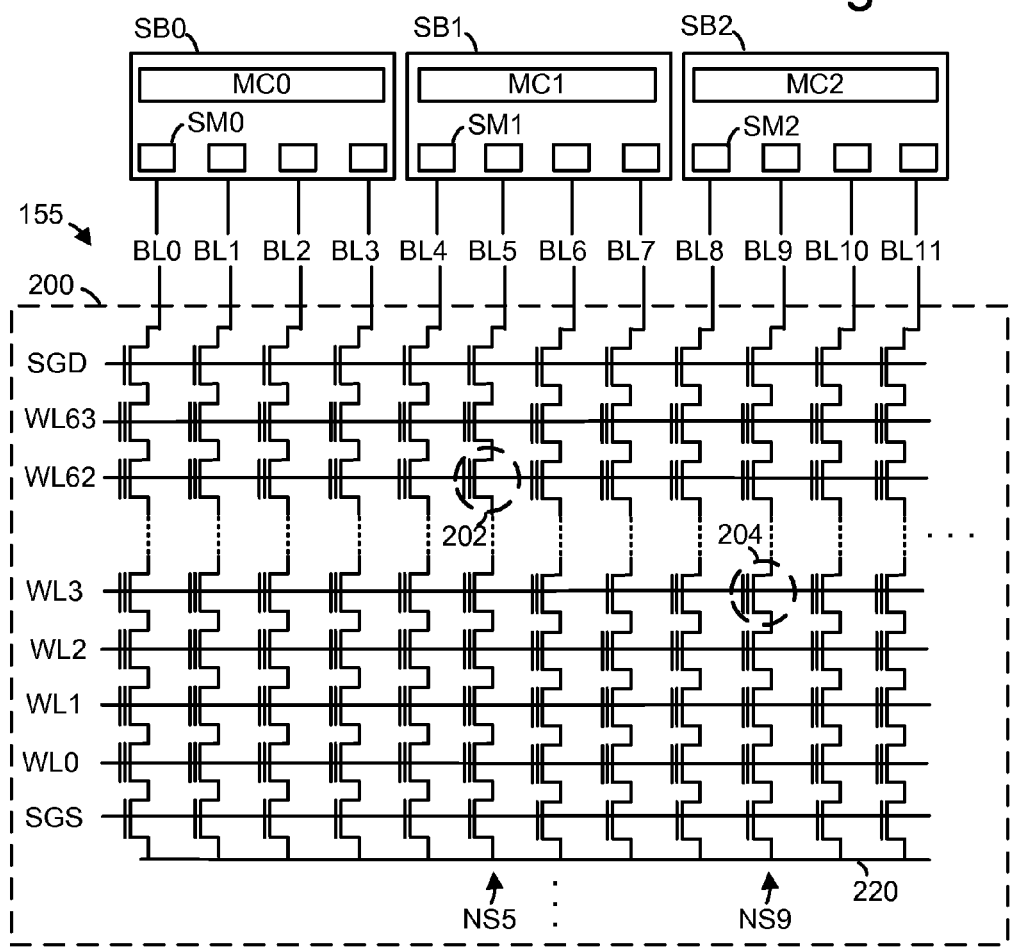
FIG. 2A depicts a block 200 of NAND flash memory cells in the memory array 155 of FIG. 1 and associated sense blocks SB0, SB1, SB2 . . . .
FIG. 2B depicts an example of the storage of pages of data in the block 200 of FIG. 2A.

In another embodiment, a non-volatile memory system uses dual row/column decoders and read/write circuits. Access to the memory array 155 by the various peripheral circuits is implemented in a symmetric fashion, on opposite sides of the array, so that the densities of access lines and circuitry on each side are reduced by half Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half FIG. 2A depicts a block of NAND flash memory cells in the memory array 155 of FIG. 1 and associated sense blocks SB0, SB1, SB2 . . . . The memory array can include many blocks. An example block 200 includes a number of NAND strings and respective bit lines, e.g., BL0-BL11, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixty-four word lines, for example, WL0-WL63, extend between the source select gates and the drain select gates.

In one approach, one sense block is provided for a group of NAND strings, such as four NAND strings. For example, SB0 is associated with BL0-BL3, SB1 is associated with BL4-BL7 and SB2 is associated with BL8-BL11. Each sense block includes a memory controller, e.g., MC0, MC1 and MC2 in SB0, SB1 and SB2, respectively. Each sense block also includes a sense module for each NAND string. Representative sense modules SM0, SM1 and SM2 are depicted in SB0, SB1 and SB2, respectively. SB0 and MC0 are discussed further in connection with FIG. 3.

Example defective storage elements are also depicted. For example, a defective storage element 202 is on WL62, in the NAND string NS5 associated with BL5, and a defective storage element 204 is on WL3, in the NAND string NS9 associated with BL9. NS5 and NS9 are therefore defective NAND strings.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 2B depicts an example of the storage of pages of data in the block 200 of FIG. 2A. As mentioned, a page of data is a unit of data which can be written or read. Typically, one or more pages of data can be stored in one word line. In this example, two pages of data are stored in one word line. For example, in the block 200, Page0A and Page0B are stored in WL0, Page1A and Page1B are stored in WL1, Page2A and Page2B are stored in WL2, Page3A and Page3B are stored in WL3, . . . , Page62A and Page62B are stored in WL62 and Page63A and Page63B are stored in WL63. In this example, the entire block is used. In other cases, only a portion of a block stores data at a given time.

Figure 3:
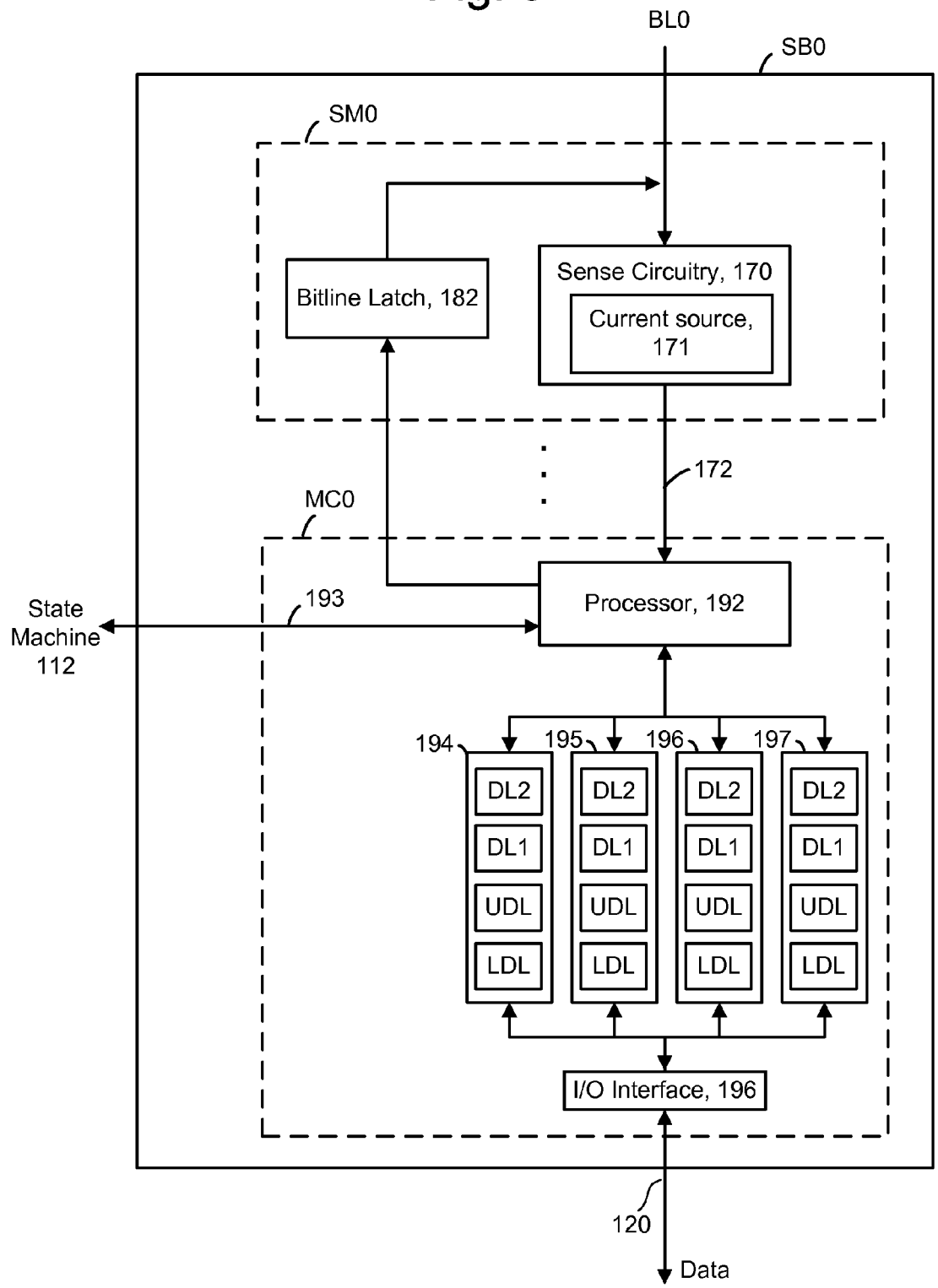
FIG. 3 is a block diagram depicting one embodiment of the sense block SB0 of FIG. 1.

FIG. 3 is a block diagram depicting one embodiment of the sense block SB0 of FIG. 1. The individual sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of multiple, e.g., four or eight, sense modules. Each of the sense modules in a group communicates with the associated managing circuit via a data bus 172. Thus, there are one or more managing circuits which communicate with the sense modules of a set of storage elements.

A sense module comprises sense circuitry 170 that performs sensing by determining whether a conduction current in a connected bit line is above or below a predetermined threshold level. The sense circuitry 170 can have a current source 171 which applies a current to a selected NAND string to evaluate whether the NAND string is defective, as discussed further below, e.g., in connection with FIG. 6C. A sense module also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 allows programming.

Managing circuit MC0 comprises a processor 192, four example sets of data latches 194-197 and an I/O Interface 196 coupled between the set of data latches 194 and data bus 120. One set of data latches can be provide for each sense module, and data latches identified by LDL, UDL, DL1 and DL2 may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element. DL1 and DL2 can be used to store a bit which indicates whether the associated storage element is fast or slow programming. In some cases, the number of extra data latches is the same as the number of phases in a multi-phase programming operation, while in other cases, the number of extra data latches is less than the number of phases in a multi-phase programming operation. In some cases, the data latches can store status bits, discussed further below.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of the state machine 112 that controls the supply of different control gate voltages to the addressed storage element. As it steps through the various predefined control gate voltages corresponding to the various memory states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit MC0, bit line latch 182 serves double duty, both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, two upper data latches, UDL1 and UDL2, may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments, the processor initially loads the bit line latch 182 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that the Vth of a storage element is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. The UDL latches can be used to store an upper page of data, for instance. A UDL latch is flipped when an upper page bit is stored in an associated storage element. The flipping of a bit occurs when an associated storage element completes programming, e.g., when its Vth exceeds a target verify level such as Vva, Vvb or Vvc. When UDL1 and UDL2 are used, UDL1 is flipped when a lower, upper bit is stored in an associated storage element, and UDL2 is flipped when an upper, upper bit is stored in an associated storage element. The lower, upper bit can also be referred to as the middle page bit. For example, in FIG. 10A-10D, the second bit is the lower, upper bit and the third bit is the upper, upper bit.

Figure 4:
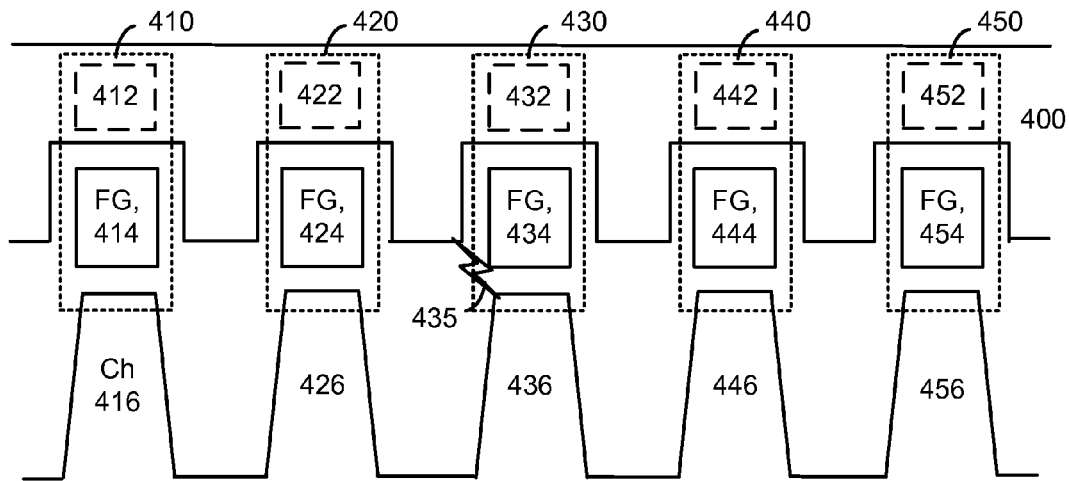
FIG. 4 depicts a cross-sectional view of NAND strings, showing a control gate-to-substrate short.

FIG. 4 depicts a cross-sectional view of NAND strings, showing a control gate-to-substrate short. A bit line or NAND string direction goes into the page, and a word line direction goes from left to right. A word line 400 extends across multiple NAND strings which include respective channel regions 416, 426, 436, 446 and 456. A storage element 410 in a first NAND string includes a control gate 412, a floating gate 414, and the channel region 416. A storage element 420 in a second NAND string includes a control gate 422, a floating gate 424, and the channel region 426. A storage element 430 in a third NAND string includes a control gate 432, a floating gate 434, and the channel region 436. A storage element 440 in a fourth NAND string includes a control gate 442, a floating gate 444, and the channel region 446. A storage element 450 in a fifth NAND string includes a control gate 452, a floating gate 454, and the channel region 456.

As mentioned at the outset, various defects can occur in storage elements. As an example, storage element 430 (a defective storage element in a defective NAND string) has a weak control gate-to-substrate short circuit path 435 from the word line/control gate 400 to the channel region 436 of the substrate. This can impair the programming process, as described in connection with FIGS. 5A and 5B.

Figure 5A:
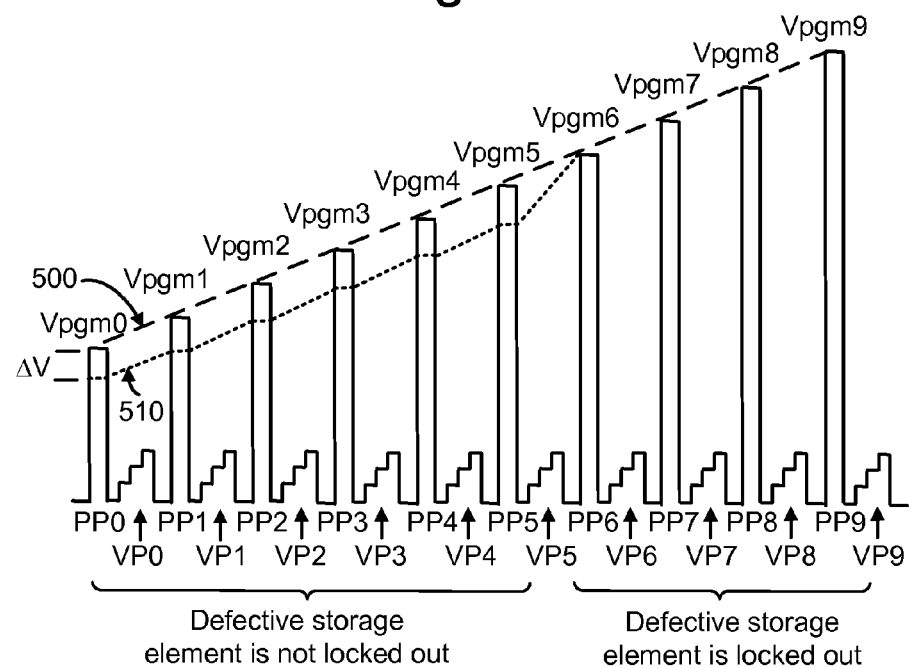
FIG. 5A depicts a programming waveform showing a reduction in an effective programming voltage due to a control gate-to-substrate short in a defective storage element and a subsequent sudden increase in the effective programming voltage when the defective storage element is inhibited.

FIG. 5A depicts a programming waveform showing a reduction in an effective programming voltage due to a control gate-to-substrate short in a defective storage element and a subsequent sudden increase in the effective programming voltage when the defective storage element is inhibited. For example, assume that defective storage element 430 and other, non-defective storage elements on the same word line are being programmed. A program voltage represented by waveform 500 is applied to the word line. The program voltage includes program pulses PP0-PP9 with magnitudes of Vpgm0-Vpgm9, respectively. Between the program pulses are verify pulses VP0-VP9. However, due to the short, the effective program voltage which is seen by the non-defective storage elements is lowered, as represented by waveform 510 in FIG. 5A. This is due to the short making a path between the word line and the channel region 436 which will typically be at 0 V.

During the program pulses PP0-PP5, the defective storage element is not locked out. During the program pulses PP6-PP9, the defective storage element is locked out. For example, the defective storage element may be locked out when a sufficient number of non-defective storage elements have completed programming to a common target data state. For instance, if the defective storage element has a target data state of the A state, it will be locked out when most other non-defective storage elements having the target data state of the A state pass a verify test for the A state, even though the defective storage element itself does not pass the verify test. Programming to the A state is considered to be successfully completed when no more than an allowable number of fail bits have not reached the A state, where the defective storage element is one of the fail bits conventionally.

When the defective storage element is locked out, it is inhibited from programming so that the short is no longer a factor. As a result, the non-defective storage elements will experience the full level of the program pulse starting at PP6. The effective level of the program pulse therefore jumps up sharply between PP5 and PP6, reducing the programming accuracy and leading to a distortion of the Vth distribution, as depicted in FIG. 5B.

Thus, a defective storage element on a word line selected for programming can impair the programming process. However, it is also possible for a defective storage element on an unselected word line to impair the programming process on a selected word line. For example, a defective storage element can affect the ability to sense the state of a non-defective storage element during a verify process.

The programming techniques provided herein avoid the reduction in effective Vpgm depicted by line 510 since defective storage elements are locked out throughout the programming operation.

Figure 5B:
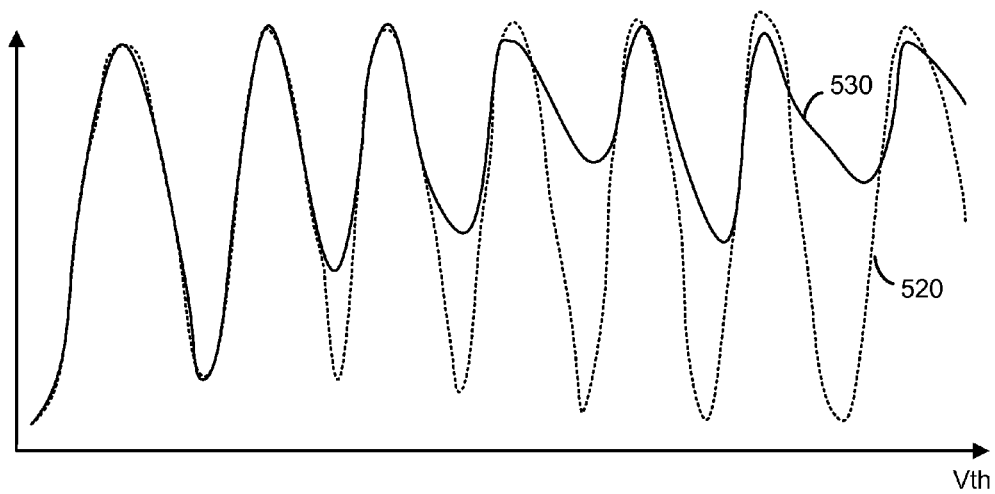
FIG. 5B depicts a threshold voltage distribution showing a distortion which is due to the sudden increase in the effective program voltage as depicted in FIG. 5A.

FIG. 5B depicts a Vth distribution showing a distortion which is due to the sudden increase in the effective program voltage as depicted in FIG. 5A. Curve 520 depicts a Vth distribution without the sudden increase in the effective program voltage, and curve 530 depicts a Vth distribution with the sudden increase in the effective program voltage. Data states A-G are shown from left to right. The distortions occur for different data states since the defective storage elements have different target data states.

FIG. 6A depicts a method for programming in which defective NAND strings are identified. The steps include: begin program operation, 600; load original bits of write data for a selected word line to a state machine, 602; evaluate NAND strings to identify one or more defective NAND strings, 604; store status bits identifying defective and non-defective NAND strings, 606; provide modified write data based on original bits of write data and status bits (e.g., perform an OR operation), 608; and write modified write data to the selected word line, 610.

In one approach, a block to be programmed is in a completely erased condition. In another approach, some word lines of the block have previously been programmed and additional erased word lines can be used for additional programming. Regarding step 602, in one approach, the state machine 112 (FIG. 1) on the chip 198 loads original bits of write data from the off-die controller 150. The original bits of write data may have undergone ECC coding. The write data may be from an external host, for instance.

Regarding step 604, a number of NAND strings, which can be, e.g., all NAND strings associated with a page of data to be written, all NAND strings in a block, a random subset of NAND strings or some other group of NAND strings, can be evaluated to determine if they contain a defect. The evaluation can involve sense/read operations. In some cases, a NAND string can be identified as being defective by identifying a specific storage element in the NAND string which is defective. In other cases, a NAND string can be identified as being defective without knowing that a specific storage element in the NAND string is defective.

Regarding step 606, once a NAND string is identified as being defective, a corresponding status bit for the NAND string can be set accordingly and stored by the state machine. In one approach, a status bit=1 is set to indicate a non-defective NAND string and a status bit=0 is set to indicate a defective NAND string. Regarding step 608, an example process for providing modified write is described in connection with FIGS. 7A-7C. Further details of step 610 are provided in FIG. 8A.

FIG. 6B depicts one approach to identifying defective NAND strings as set forth in step 604 of FIG. 6A. The steps include: select word line to read, 620; apply control gate demarcation voltage to one or more selected word lines; apply pass voltage to other word lines, 622; sense whether Vth of storage elements is not below demarcation voltage, 624; identify as defective, NAND strings for storage elements for which Vth is not below demarcation voltage, 626; select another word line?, 628 (where step 620 follows if "yes" and step 630 follows if "no"); and finish, 630. Regarding the selection of one or more word lines to evaluate, this can include, e.g., a selected word line in which programming is to occur, another (unselected) word line in a block, a word line which is adjacent to a selected word line, all word lines in a block, a randomly selected group of word lines in a block or some other group of one or more word lines in a block. It is also possible to select multiple word lines concurrently so that a defect can be identified in a group of multiple storage elements in a NAND string.

In one approach, the set of NAND strings comprises storage elements arranged in a set of word lines, the modified write data is written into storage elements of one word line (a selected word line) of the set of word lines, and the evaluating is performed on storage elements of another word line (an unselected word line) of the set of word lines. In another approach, the evaluating is performed on the storage elements of the one word line (the selected word line) of the set of word lines in which case the evaluation and writing is on the same selected word line.

Regarding step 622, the control gate demarcation voltage or read voltage can be, e.g., a Vth level which is above an expected Vth level of the storage element. For example, if the storage element is expected to be in an erased state, the control gate demarcation voltage can be at a level which is higher than the erased state. It is also possible for the control gate demarcation voltage to be at a level which is below an expected level of the storage element. Generally, a goal is to identify a storage element whose Vth is not at an expected level or in an expected range. When a range is of concern, it is possible to apply more than one control gate demarcation voltage (e.g., at upper and lower bounds of the range) to identify a defective storage element. Word lines which do not receive the control gate demarcation voltage can receive a pass voltage which is sufficiently high to render the associated storage elements in a conductive state so that they do not affect the sensing in step 624.

Regarding step 624 (a sense/read operation), this assumes a goal is to detect a defective storage element which has a Vth which is above the control gate demarcation voltage. Such a storage element will be sensed as being in a non-conductive state when the control gate demarcation voltage is applied. The sensing of step 624 can occur for one NAND string, or for multiple NAND strings concurrently.

FIG. 6C depicts another approach to identifying defective NAND strings as set forth in step 604 of FIG. 6A. The steps include: apply control gate voltage to selected word line; apply control gate voltage to one or more selected word lines; apply pass voltage to other word lines, 640; apply current source to NAND strings, 642; sense whether current flowing in NAND strings is above a demarcation level, 644; and identify as defective, NAND strings for which current is above the demarcation level, 646.

Generally, a defective storage element can be leaky such that an amount of current which passes through the storage element exceeds a threshold level when a specific control gate voltage is applied to the storage element. Similarly, a defective storage element may pass a lower than expected amount of current when a specific control gate voltage is applied to the storage element. The current should be in a normal range based on a desired current-to-control gate voltage characteristic of the storage elements. In this case, step 644 (a sense/read operation) can be modified to sense whether current flowing in the NAND strings is in an acceptable range, and step 646 can be modified to identify as defective, NAND strings for which current is outside the acceptable range.

The selection of one or more word lines and NAND strings can occur as discussed above in connection with FIG. 6B. Similarly, the sensing of step 644 can occur for one NAND string, or for multiple NAND strings concurrently. Regarding step 642, the current source 171 in FIG. 1 may be used to apply current source to a NAND string.

Figures 7A, 7B, 7C:
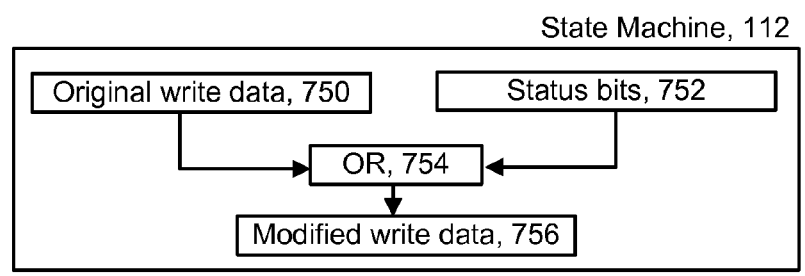
FIG. 7A depicts the calculation of modified write data as set forth in step 608 of FIG. 6A.
FIG. 7B depicts an OR operation as used to calculate modified write data in FIG. 7A.
FIG. 7C depicts the state machine 112 of FIG. 1 performing the calculation of modified write data at as set forth in step 608 of FIG. 6A.

FIG. 7A depicts the calculation of modified write data as set forth in step 608 of FIG. 6A. Consistent with the block 200 of FIG. 2A, consider word lines WL0-WL63 and bit lines BL0-BL11. In the table, row (1) identifies the bit line, e.g., BL0-BL11. Row (2) identifies status bits for WL62. Row (3) identifies status bits for WL3. Row (4) identifies status bits for other word lines. Row (5) identifies NAND string status bits. These are the status bits identifying defective and non-defective NAND strings of step 606 of FIG. 6A. Row (6) identifies original write data bits. Row (7) identifies modified write data bits and is obtained from an OR of rows (5) and (6).

In one approach, the NAND string status bits are obtained from word line level status bits which identify individual storage elements as being defective (1) or non-defective (0). However, as mentioned, in some cases a NAND string can be identified as being defective without identifying an individual defective storage element and without evaluating each individual storage element in a block. In one approach, a defective NAND string is a NAND string with one or more defective storage elements. NAND strings associated with BL5 and BL9 meet this criterion and are therefore considered to be defective. The remaining NAND strings do not meet this criterion and are therefore considered to be non-defective.

Recall that each original bit of the write data controls whether programming occurs in a respective NAND string of a set of NAND strings. A convention is used in which write data having one bit value (0) allows programming in a respective NAND string, and write data having an opposite bit value (1) prohibits programming in the respective NAND string. For a defective NAND string where the original bit is 0, the bit is changed from 0 to 1 to prohibit programming. For a defective NAND string, if any, where the original bit is 1, the bit is not changed. Similarly, for a non-defective NAND string, the bit is not changed regardless of whether the original bit is 0 or 1.

FIG. 7B depicts an OR operation as used to calculate modified write data in FIG. 7A. By assigning a status bit value of 0 to a non-defective NAND string, and a status bit value of 1 to a defective NAND string, and using the convention that a write bit with a value of 0 indicates that programming is to take place in a respective NAND string, the OR operation yields a 1, indicating that programming is prohibited in the respective NAND string. Thus, the write bit is flipped for a defective NAND string so that programming does not occur. The NAND string will therefore be inhibited throughout the programming, avoiding the distorted programming results such as described in connection with FIGS. 5A and 5B. When the data is subsequently read, such as described in connection with FIG. 8B, one approach is use an ECC process to identify the flipped bits as error bits and flip them back to their original value, thereby recovering the original write data. Another approach is to access the status bits, use them to identify the flipped bits and flip the modified write bits back to their original value. The OR operation does not flip a write bit for a defective NAND string where the original bit is 1, or for a non-defective NAND string where the original bit is 0 or 1. The OR operation can be used in an example implementation, as other analogous operations are possible.

FIG. 7C depicts the state machine 112 of FIG. 1 performing the calculation of modified write data at as set forth in step 608 of FIG. 6A. The state machine receives and stores the original write data 750, such as from the off-die controller 150. The off-die controller 150 may in turn receive the write data from an external host. The external host, off-die controller 150 or state machine may perform encoding such as ECC coding, for instance. The term "original write data" or the like is meant to denote the write data which would be written to the memory array in the absence of the modification provided based on defect detection as described herein. The status machine can access the status bits 752 from the processor 192 of the sense block (FIG. 3). The processor can obtain the status bits from the sense modules based on a result of sensing in the associated NAND strings. An OR function 754 is used to provide the modified write data 756.

Figure 8A:
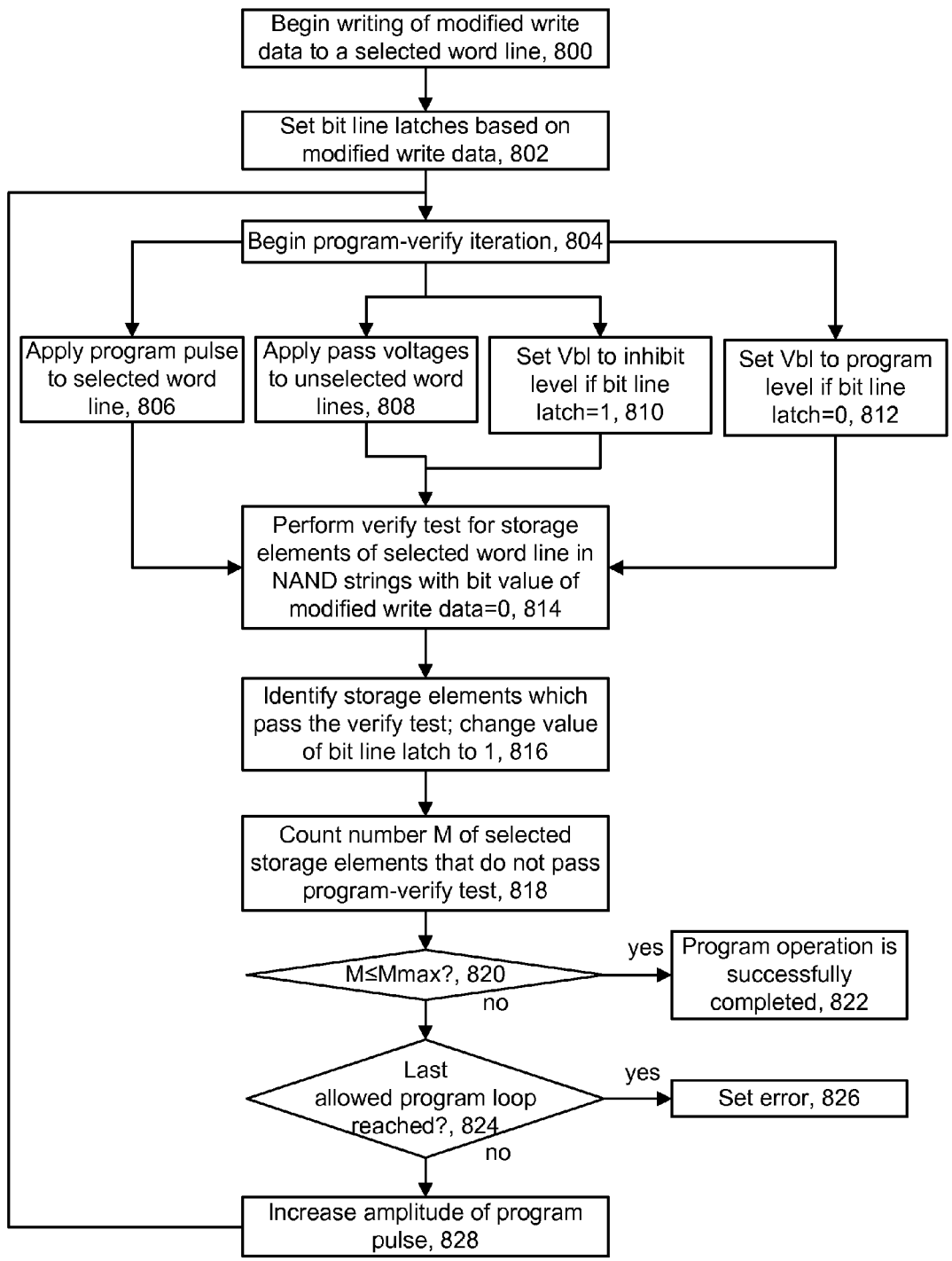
FIG. 8A depicts a process for writing modified write data as set forth in step 610 of FIG. 6A.

FIG. 8A depicts a process for writing modified write data as set forth in step 610 of FIG. 6A. The steps include: begin writing of modified write data to a selected word line, 800; set bit line latches based on modified write data, 802; begin program-verify iteration, 804; apply program pulse to selected word line, 806; apply pass voltages to unselected word lines, 808; set Vb1 to inhibit level if bit line latch=1, 810; set Vb1 to program level if bit line latch=0, 812; perform verify test for storage elements of selected word line in NAND strings with bit value of modified write data=0, 814; identify storage elements which pass the verify test; change value of bit line latch to 1, 816; count number M of selected storage elements that do not pass program-verify test, 818; M≤Mmax?, 820 (where step 822 follows if "yes" and step 824 follows if "no"); program operation is successfully completed, 822; last allowed program loop reached?, 824 (where step 826 follows if "yes" and step 828 follows if "no"); set error, 826; and increase amplitude of program pulse, 828. Steps 806, 808, 810 and 812 can be concurrent.

Regarding step 802, the bit line latch can be set with a bit value of 1 if the respective NAND string is to be inhibited, or 0 if the respective NAND string is to be programmed. In step 810, the inhibit level can be Vdd, e.g., 2-3 V. In step 812, the program level can be, e.g., 0-0.6 V. At step 814, it is only necessary to perform a verify test for the storage element which are being programmed, that is, the storage element for which the modified write bit=0. At step 816, the bit line latch is flipped from 0 to 1 if the verify test is passed so that the NAND string will be inhibited in the next program-verify iteration and all subsequent program-verify iterations. The bit line latch remains at 0 if the verify test is not passed so that the NAND string will be subject to programming again in the next program-verify iteration. At step 820, if the number of fail bits is below a maximum allowable count, the program operation is successfully completed at step 822. If the number of fail bits is not below the maximum allowable count, decision step 824 determines if another program loop (e.g., program-verify iteration) is allowed. If another program loop is allowed, the program pulse is stepped up in amplitude at step 828 and the next program-verify iteration takes place at step 804. If another program loop is not allowed, an error is set at step 826 since the programming operation has not successfully completed.

Regarding Mmax and step 820, a baseline value of Mmax which is used without the techniques herein can be reduced with use of the techniques herein since there will be fewer failures. This is because the defective NAND strings will not result in a failure to pass the program-verify test.

FIG. 8B depicts a process for reading modified write data. The process generally involves reading the modified write data from the set of NAND strings, and either accessing the status bits or performing ECC decoding, to change the flipped bit for each of the one or more defective NAND strings back to the one bit value (0).

Specifically, the steps include: begin read operation, 850; read modified write data from selected word lines, 852; and access status bits from storage or use ECC decoding to identify and change the flipped bits, 854. Step 850 can be a normal read operation for distinguishing the data states of the storage elements. For example, sense operations at different threshold voltages can be performed. In one approach, the state machine obtains the modified write data that is read and processes it by flipping any 1 bit back to 0 for which the associated (same NAND string) status bit=1, indicating that there was a defect in the NAND string. The state machine does not flip any 0 bit when the status bit is 0 (indicating no defect in the associated NAND string) or 1 (indicating a defect in the associated NAND string). Or, to avoid the need to store the status bits after programming is completed, ECC decoding can be used to identify the flipped bits as error bits and flip them back to their original value. As a result, the original data can be recovered.

FIGS. 9A-C depict programming of lower and upper pages in two-bit, four-level storage elements. Each graph depicts Vth on the horizontal axis and a number or population of storage elements in a Vth distribution on the vertical axis. In this case, each storage element can store two bits of data in one of four possible Vth ranges, referred to as states E, A, B and C. Moreover, the bits are classified into lower and upper page data. Thus, a first bit of each storage element forms a lower page of data, and a second bit of each storage element forms an upper page of data.

Programming can be performed one logical page at a time, with the lower page followed by the upper page. Initially, all storage elements are in the erased (E) state, represented by the distribution 900 in FIG. 9A.

FIG. 9B depicts programming of a lower page of data. If the lower page has a bit=1, the associated storage element remains in the distribution 900, and the data is represented by x1, where x is an upper page bit that is not yet known. If the lower page has a bit=0, the storage element is programmed to a higher Vth as represented by distribution 902, which is a first interim distribution (INT), using a verify level Vv1. The data of these storage elements is represented by x0. Note that the interim distribution can be relatively wide since it is not a final distribution and does not represent a final data state.

FIG. 9C depicts programming of an upper page of data. If the upper page has a bit=1, and the lower page has a bit=1, the associated storage element in the distribution 900 remains in the distribution 900 and stores data bits 11. If the upper page has a bit=0, and the lower page has a bit=1, the associated storage elements in the distribution 900 are programmed to the distribution 904 using the verify level of Vva. If the upper page has a bit=1, and the lower page has a bit=0, the associated storage elements in the distribution 902 are programmed to the distribution 908 using the verify level Vvc. If the upper page has a bit=0, and the lower page has a bit=0, the associated storage elements in the distribution 902 are programmed to the distribution 906 using the verify level Vvb. Read voltages Vra, Vrb and Vrc are also depicted.

Figure 9D:
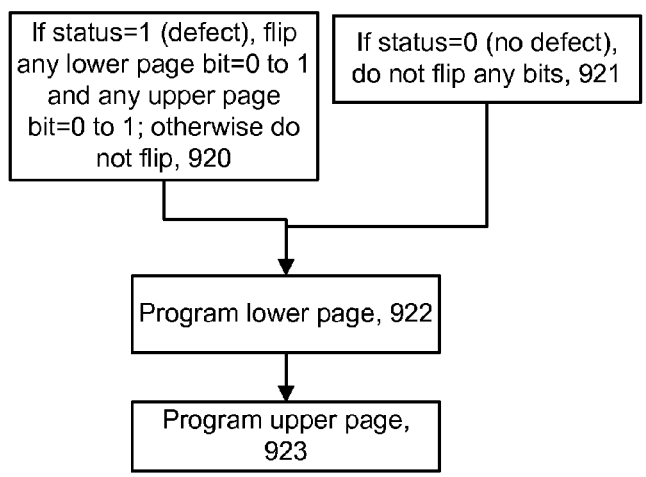
FIG. 9D depicts a two-bit per storage element programming process corresponding to FIGS. 9A-9C.

FIG. 9D depicts a two-bit per storage element programming process corresponding to FIGS. 9A-9C. The techniques described herein for preventing programming in defective NAND strings can be applied to writing of one or more pages of data. The bit representing each page of write data can be flipped when the status bit=1 indicates a defect and the bit of write data=0 (for any page of data). At other times, when the status bit=1 indicates a defect and the bit of write data=1, or when the status bit=0 indicates no defect and the bit of write data=0 or 1, the bit is not flipped.

Example steps include: If status=1 (defect), flip any lower page bit=0 to 1 and any upper page bit=0 to 1; otherwise do not flip, 920; If status=0 (no defect), do not flip any bits, 921; Program lower page, 922; and Program upper page, 923. In this example, there are two pages but, generally, any number can be used, such as two or more pages.

Figure 9E:
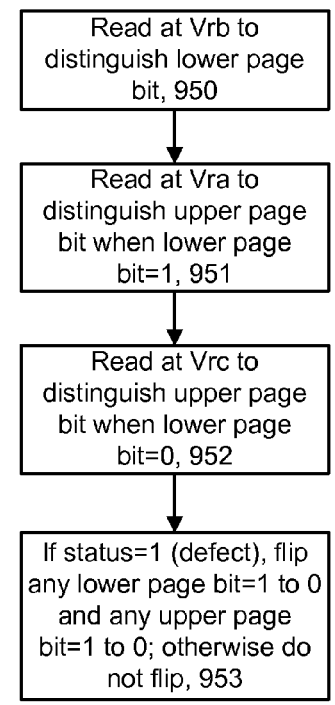
FIG. 9E depicts a two-bit per storage element reading process corresponding to FIGS. 9A-9C.

FIG. 9E depicts a two-bit per storage element reading process corresponding to FIGS. 9A-9C. The reading process is essentially a mirror image of the programming process. Step 950 is to read at Vrb to distinguish a lower page bit. Step 951 is to read at Vra to distinguish the upper page bit when the lower page bit (which was read)=1. Step 952 is to read at Vrc to distinguish the upper page bit when the lower page bit (which was read)=0. Step 953 states: If status=1 (defect), flip any lower page bit=1 to 0 and any upper page bit=1 to 0; otherwise do not flip, 953.

Programming can be similarly extended to three or more bits per storage element. For example, FIGS. 10A-D depict programming of lower, middle and upper pages in three-bit, eight-level storage elements. Initially, all storage elements are in the erased (E) state, represented by the distribution 1000 in FIG. 10A. The lower page is programmed in FIG. 10B. If the lower page is bit=1, storage elements in distribution 1000 remain in that distribution. If the lower page is bit=0, storage elements in distribution 1000 are programmed to an interim distribution 1002 using verify level Vv1. The middle page is programmed in FIG. 10B. If the middle page is bit=1, storage elements in distribution 1000 remain in that distribution, and storage elements in distribution 1002 are programmed to interim distribution 1008 using verify level Vv4. If the middle page is bit=0, storage elements in distribution 1000 are programmed to interim distribution 1004 using verify level Vv2, and storage elements in distribution 1002 are programmed to interim distribution 1006 using verify level Vv3.

Figure 10A:
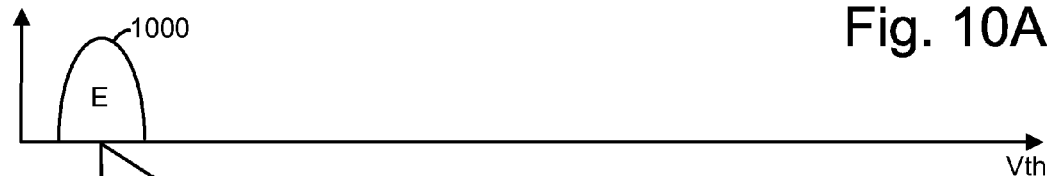
FIGS. 10A-D depict programming of lower, middle and upper pages in three-bit, eight-level storage elements.
Figure 10B:
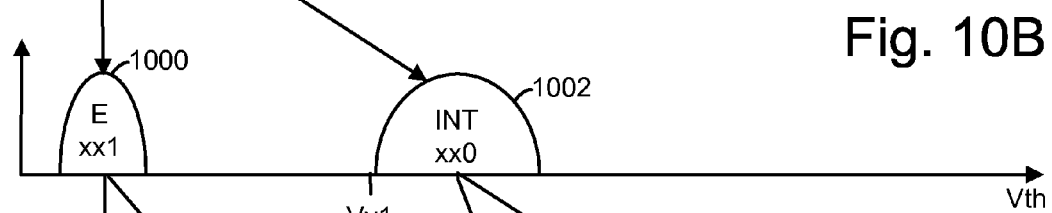
Figure 10C:
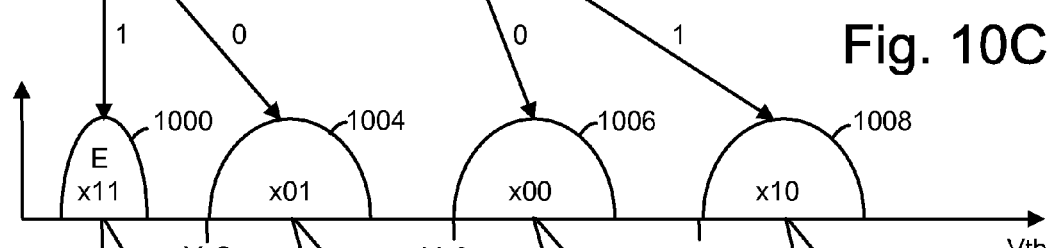
Figure 10D:
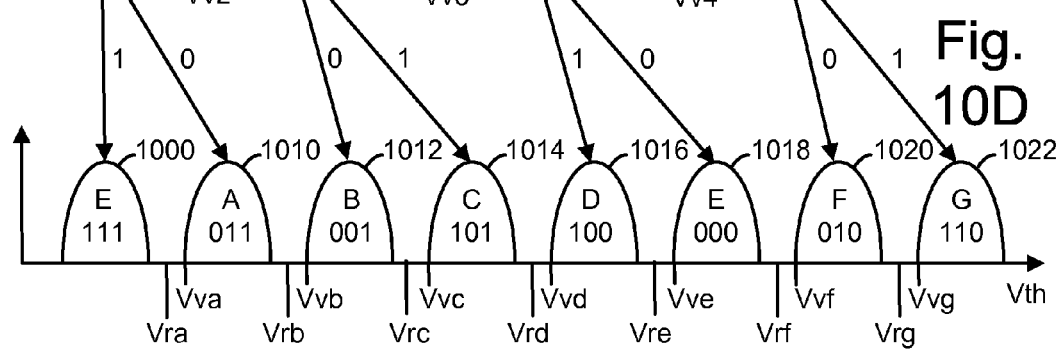

The upper page is programmed in FIG. 10C. If the upper page is bit=1, storage elements in distribution 1000 remain in that distribution, storage elements in distribution 1004 are programmed to distribution 1014 (state C) using verify level Vvc, storage elements in distribution 1006 are programmed to distribution 1016 (state D) using verify level Vvd, and storage elements in distribution 1008 are programmed to distribution 1022 (state G) using verify level Vvg. If the upper page is bit=0, storage elements in distribution 1000 are programmed to distribution 1010 (state A) using verify level Vva, storage elements in distribution 1004 are programmed to distribution 1012 (state B) using verify level Vvb, storage elements in distribution 1006 are programmed to distribution 1018 (state E) using verify level Vve, and storage elements in distribution 1008 are programmed to distribution 1020 (state F) using verify level Vvf. Read voltages Vra, Vrb, Vrc, Vrd, Vre, Vrf and Vrg are also depicted.

Programming using four bits per cell (16 levels) can similarly involve lower, lower-middle, upper-middle and upper pages.

A programming process and a corresponding read process for the case of three or more pages can be defined using similar principles as for the case of two pages as described in connection with FIG. 9D and FIG. 9E.

Figure 11A:
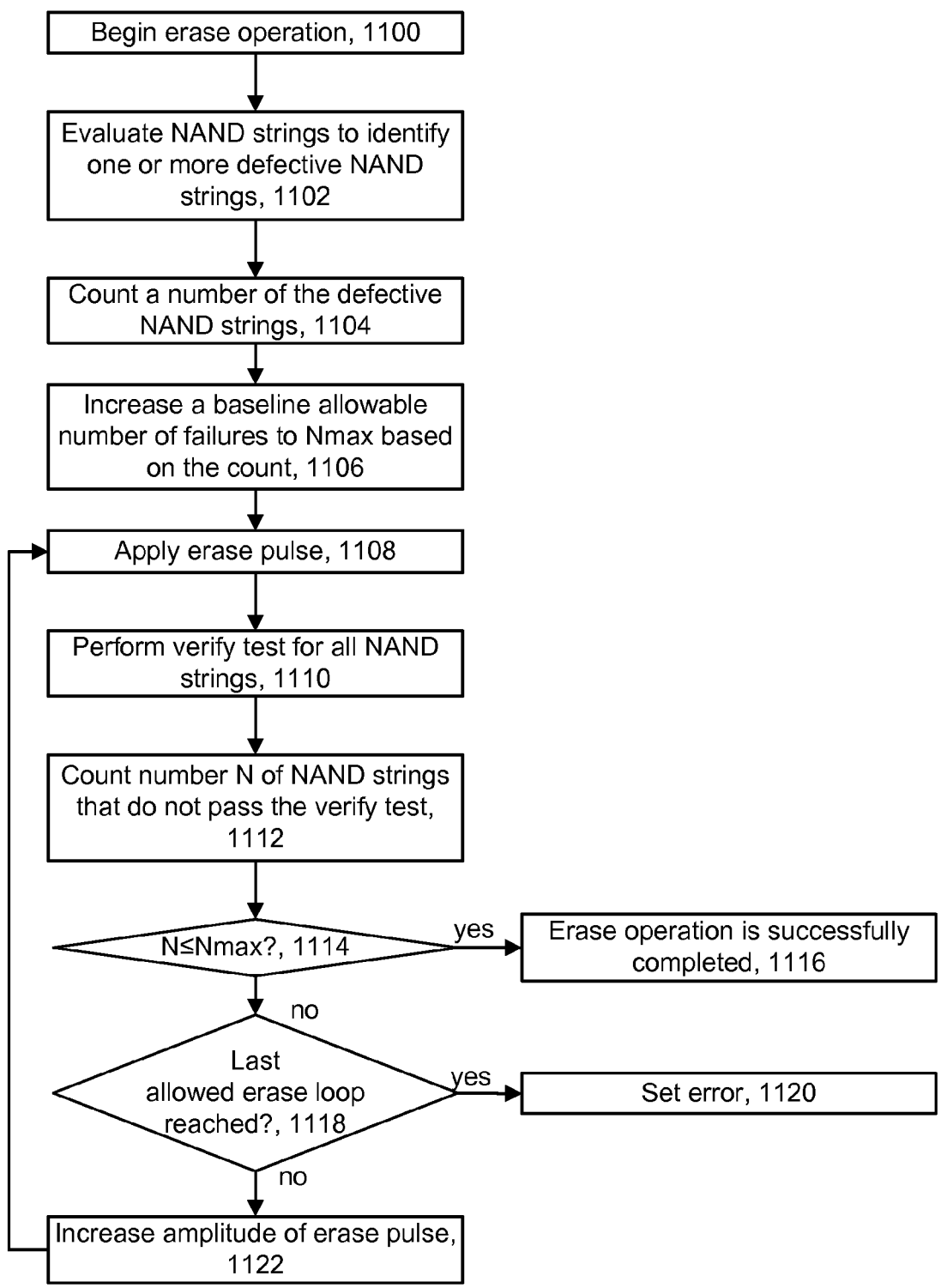
FIG. 11A depicts a method for erasing in which defective NAND strings are identified and counted.

FIG. 11A depicts a method for erasing in which defective NAND strings are identified and counted. The steps include: begin erase operation, 1100; evaluate NAND strings to identify one or more defective NAND strings, 1102; count a number of the defective NAND strings, 1104; increase an allowable number of failures to Nmax based on the count, 1106; Apply erase pulse, 1108; perform verify test for all NAND strings, 1110; count number N of NAND strings that do not pass the verify test, 1112; N≤Nmax?, 1114; erase operation is successfully completed, 1116 (reached if step 1114 is "yes"); last allowed erase loop reached?, 1118 (reached if step 1114 is "no"); set error, 1120 (reached if step 1118 is "yes"); and increase amplitude of erase pulse, 1122 (reached if step 1118 is "no").

As mentioned, in an erase process, a count of defective NAND strings can be made and used to adjust a pass condition of a verify test. For example, the allowable number of failures (e.g., NAND strings which do not pass a verify test) can be increased based on the count. As a result, the number of erase loops will not be increased and reliability issues will be avoided. The identification of defective NAND strings at step 1102 can be as described in step 604 of FIG. 6A and in FIGS. 6B and 6C. Step 1106 can increase a baseline allowable number of failures which might be, e.g., 1-10% of the number of NAND strings in a block. The increase can be the same as the count of the number of defective NAND strings, for example. Thus, the baseline allowable number of failures is N1, the number of defective NAND strings is N2, and Nmax=N1+N2. The verify test of step 1110 can involve applying a control gate voltage such as Vv_erase (FIG. 11B) on each word line in a block, and sensing each NAND string to determine if the NAND string is in a conductive or non-conductive state. If a NAND string is in a conductive state, the Vth of each storage element in the NAND string is less than Vv_erase, so that the NAND string passes the verify test.

Figure 11B:
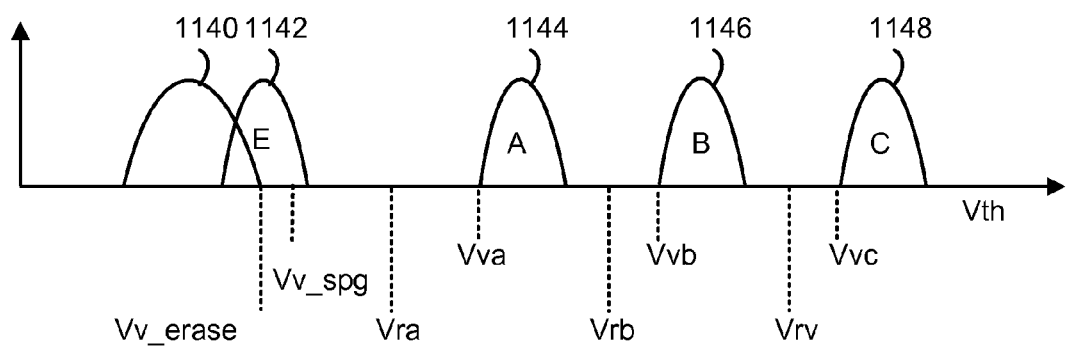
FIG. 11B depicts example threshold voltage distributions of an erased state and higher data states for a set of non-volatile storage elements.

FIG. 11B depicts example threshold voltage distributions of an erased state and higher data states for a set of non-volatile storage elements. The x-axis indicates a Vth and the y-axis indicates a number of storage elements. In this example, there are four data states: an erased (E) state 1142, an A state 1144, a B state 1146 and a C state 1148. Memory devices with additional data states, e.g., eight or sixteen data states, or fewer states, e.g., two states, can also be used. An erase sequence can include an erase operation and an optional soft programming operation. The distribution 1140 is realized after the erase operation when storage elements are typically over-erased, past the erase state 1142. An erase operation can include successive erase-verify iterations (see FIG. 11C). Each erase-verify iteration includes an erase iteration comprising an erase pulse followed by a verify iteration comprising a verify pulse and sensing operation. Erase pulses are applied to the substrate until the Vth of the storage elements being erased transitions below an erase verify level, Vv_erase.

Once the erase operation is completed, the soft programming operation can optionally be performed, in which a number of positive voltage pulses are applied to the control gates of the storage elements, such as via a word line, to increase the threshold voltages of some or all of the storage elements in the distribution 1140 closer to and below a soft programming verify level, Vv_spgm, to the erased state 1142. Vv_spgm is typically above or equal to Vv_erase. The soft programming operation advantageously results in a narrow erase state distribution 1142. Once the soft programming operation is complete, programming to higher data states can occur, such as to states A, B and C using verify levels Vv_A, Vv_B and Vv_C, respectively. A subsequent read operation can use the levels Vread_A, Vread_B and Vread_C.

Figure 11C:
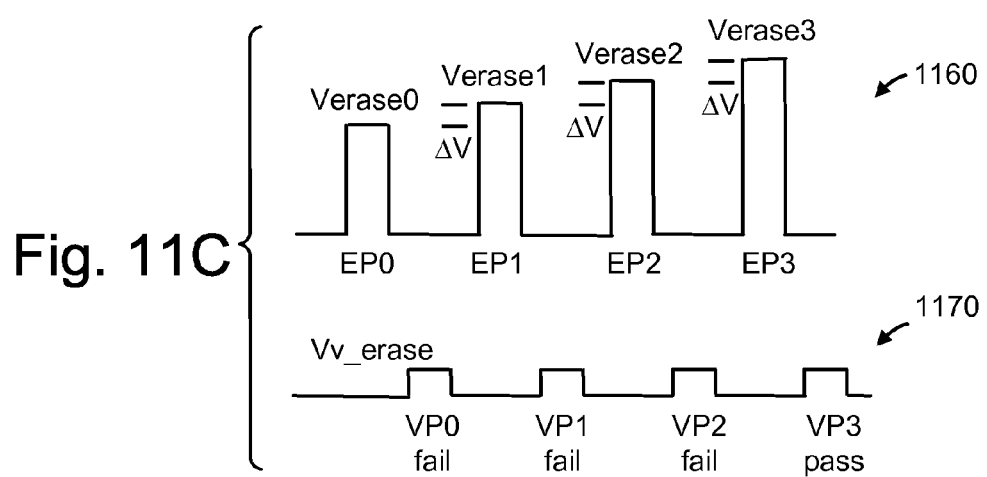
FIG. 11C depicts an example erase operation in which each erase pulse is followed by a verify pulse.

FIG. 11C depicts an example erase operation in which each erase pulse is followed by a verify pulse. An erase operation can be performed for a block of storage elements by applying one or more erase pulses, e.g., EP0-EP3 (waveform 1160) to a substrate on which the block is formed. After the first erase pulse EP0, the peak amplitude of each erase pulse can be stepped up from the previous erase pulse by a step size ΔV. In one approach, after each erase pulse is applied to the substrate, a verify operation is performed as represented by waveform 1170. Waveform 1170 shows verify pulses or voltages VP0-VP3 of amplitude Vv_erase which are applied to one or more word lines of storage elements being erased. VP0-VP3 are verify pulses associated with, and following, EP0-EP3, respectively. In this example, it is assumed that the erase operation ends successfully (step 1116 of FIG. 11A) after VP3. Thus, the verify test associated with VP0-VP2 is failed, and the verify test associated with VP3 is passed.

Accordingly, it can be seen that, in one embodiment, a non-volatile storage apparatus comprises a set of NAND strings in a block, and one or more control circuits. The one or more control circuits: one or more control circuits, the one or more control circuits: load original bits of write data, each original bit controls whether programming occurs in a respective NAND string of the set of NAND strings; in response to the load, perform an evaluation of the set of NAND strings to identify one or more defective NAND strings, remaining NAND strings of the set of NAND strings are non-defective NAND strings; provide modified write data, the modified write data comprising: (a) a flipped bit having a bit value (1) which prohibits programming for each of the one or more defective NAND strings for which the original bit of write data has a bit value (0) which allows programming, and (b) the original bit for each of the non-defective NAND strings; and write the modified write data into the set of NAND strings. The modified write data may further comprise the original bit for each of one or more defective NAND strings for which the original bit of write data has the bit value (1) which prohibits programming.

In another embodiment, a method for programming non-volatile storage elements is provided. The method includes: loading original bits of write data, each original bit controls whether programming occurs in a respective NAND string of a set of NAND strings; in response to the loading, evaluating one or more NAND strings of the set of NAND strings to identify one or more defective NAND strings, remaining NAND strings of the set of NAND strings are non-defective NAND strings; providing modified write data, the modified write data comprising: (a) a flipped bit having a bit value (1) which prohibits programming for each of the one or more defective NAND strings for which the original bit of write data has a bit value (0) which allows programming, and (b) the original bit for each of the non-defective NAND strings; and writing the modified write data into the set of NAND strings.

In another embodiment, a non-volatile storage apparatus comprises a set of NAND strings in a block, and one or more control circuits. The one or more control circuits: perform an evaluation of one or more NAND strings in the set of NAND strings to identify one or more defective NAND strings; count a number of the one or more defective NAND strings; increase an allowable number of failures based on the count; and perform erase-verify iterations of an erase operation on the block until the erase operation is successfully completed, the erase operation is successfully completed when no more than the allowable number of failures do not pass a verify test.

In another embodiment, a method for erasing non-volatile storage elements comprises: evaluating one or more NAND strings in a set of NAND strings in a block to identify one or more defective NAND strings; counting a number of the one or more defective NAND strings; increasing an allowable number of failures based on the count; and performing erase-verify iterations of an erase operation on the block until the erase operation is successfully completed, the erase operation is successfully completed when no more than the allowable number of failures do not pass a verify test.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A non-volatile storage apparatus, comprising:
a set of NAND strings in a block; and
one or more control circuits, the one or more control circuits:
load original bits of write data, each original bit controls whether programming occurs in a respective NAND string of the set of NAND strings;
in response to the load, perform an evaluation of the set of NAND strings to identify one or more defective NAND strings, remaining NAND strings of the set of NAND strings are non-defective NAND strings, the evaluation comprises read operations for storage elements along a word line, the storage elements along the word line are expected to be in an erased state, the one or more defective strings are identified by one or more of the storage elements which are expected to be in the erased state but which are not in the erased state, and the remaining NAND strings are identified by remaining storage elements along the word line which are expected to be in the erased state and which are in the erased state;
provide modified write data, the modified write data comprising: a flipped bit having a bit value which prohibits programming for each of the one or more defective NAND strings for which the original bit of write data has a bit value which allows programming, and the original bit for each of the non-defective NAND strings; and
write the modified write data into the set of NAND strings.

2. The non-volatile storage apparatus of claim 1, wherein:
results of the read operations are stored as a status bit for each NAND string in the set of NAND strings, the status bit has the bit value which prohibits programming for each of the one or more defective NAND strings and the bit value which allows programming for each of the non-defective NAND strings; and
the modified write data is provided by performance of an OR operation of the status bit with the original bit for each NAND string in the set of NAND strings; and
the modified write data comprises the original bit for each of one or more defective NAND strings for which the original bit of write data has the bit value which prohibits programming.

3. The non-volatile storage apparatus of claim 2, wherein:
the status bits are stored in a set of data latches associated with the respective NAND strings; and
the one or more control circuits comprise a state machine on a chip which receives the status bits from the set of data latches, generates and stores the modified write data, and communicates the modified write data to another set of data latches associated with the respective NAND strings to write the modified write data into the set of NAND strings.

4. The non-volatile storage apparatus of claim 1, wherein: the one or more control circuits comprise a state machine on a die which loads the original bits of write data from a controller off the die, generates and stores the modified write data, and communicates the modified write data to a set of data latches associated with the respective NAND strings to write the modified write data into the set of NAND strings.

5. The non-volatile storage apparatus of claim 1, wherein: the evaluation does not write data to the set of NAND strings.

6. A method for programming non-volatile storage elements, comprising:
   loading original bits of write data, each original bit controls whether programming occurs in a respective NAND string of a set of NAND strings;
   in response to the loading, evaluating the set of NAND strings to identify one or more defective NAND strings, remaining NAND strings of the set of NAND strings are non-defective NAND strings, the evaluating comprises performing read operations for the set of NAND strings but not write operations for the set of NAND strings;
   providing modified write data, the modified write data comprising: a flipped bit having a bit value which prohibits programming for each of the one or more defective NAND strings for which the original bit of write data has a bit value which allows programming, and the original bit for each of the non-defective NAND strings; and
   writing the modified write data into the set of NAND strings.

7. The method of claim 6, wherein:
   results of the read operations are stored as a status bit for each NAND string in the set of NAND strings, the status bit has the bit value which prohibits programming for each of the one or more defective NAND strings and the bit value which allows programming for each of the non-defective NAND strings; and
   the providing the modified write data comprises performing an OR operation of the status bit with the original bit for each NAND string in the set of NAND strings.

8. The method of claim 6, further comprising:
   reading the modified write data from the set of NAND strings; and
   performing error correction code decoding to identify the flipped bit for each of the one or more defective NAND strings and to change the flipped bit back to the bit value which allows programming.

9. The method of claim 6, wherein:
   the set of NAND strings comprises storage elements arranged in a set of word lines;
   the modified write data is written into storage elements of a selected word line of the set of word lines; and
   the evaluating is performed on storage elements of an unselected word line of the set of word lines.

10. The method of claim 6, wherein:
    the set of NAND strings comprises storage elements arranged in a set of word lines;
    the modified write data is written into storage elements of a selected word line of the set of word lines; and
    the evaluating is performed on the storage elements of the selected word line.

11. The method of claim 6, wherein:
    the evaluating comprises determining that a current in the one or more defective NAND strings is above a demarcation level.

12. The method of claim 6, wherein:
    the evaluating comprises determining that a threshold voltage of a storage element in the one or more defective NAND strings is above a demarcation voltage.

13. The method of claim 6, further comprising:
    reducing an allowable number of fail bits in the write of the modified write data into the set of NAND strings, based on a number of the one or more defective NAND strings.

14. The method of claim 6, wherein:
    the modified write data comprises the original bit for each of one or more defective NAND strings for which the original bit of write data has the bit value which prohibits programming.

15. The method of claim 6, wherein:
    the read operations are performed for storage elements along a word line, the storage elements along the word line are expected to be in an erased state, the one or more defective strings are identified by one or more of the storage elements which are expected to be in the erased state but which are not in the erased state, and the remaining NAND strings are identified by remaining storage elements along the word line which are expected to be in the erased state and which are in the erased state.

16. A non-volatile storage apparatus, comprising:
    a set of NAND strings in a block; and
    one or more control circuits, the one or more control circuits:
      perform an evaluation of one or more NAND strings in the set of NAND strings to identify one or more defective NAND strings;
      count a number of the one or more defective NAND strings;
      increase an allowable number of failures based on the count, the allowable number of failures is obtained from a sum of a baseline allowable number of failures and the number of the one or more defective NAND strings; and
      perform erase-verify iterations of an erase operation on the block until the erase operation is successfully completed, the erase operation is successfully completed when no more than the allowable number of failures do not pass a verify test.

17. The non-volatile storage apparatus of claim 16, wherein:
    the evaluation determines that a threshold voltage of a storage element in the one or more defective NAND strings in the set of NAND strings is above a demarcation voltage.

18. A method for erasing non-volatile storage elements, comprising:
    evaluating one or more NAND strings in a set of NAND strings in a block to identify one or more defective NAND strings;
    counting a number of the one or more defective NAND strings;
    increasing an allowable number of failures based on the count, the allowable number of failures is obtained from a sum of a baseline allowable number of failures and the number of the one or more defective NAND strings; and
    performing erase-verify iterations of an erase operation on the block until the erase operation is successfully completed, the erase operation is successfully completed when no more than the allowable number of failures do not pass a verify test.

19. The method of claim 18, wherein:
the evaluation determines that a current in the one or more defective NAND strings is above a demarcation level.

20. The method of claim 18, wherein:
the evaluation determines that a threshold voltage of a storage element in the one or more defective NAND strings in the set of NAND strings is above a demarcation voltage.

* * * * *